(12) United States Patent
Klingel

(10) Patent No.: US 8,399,067 B2
(45) Date of Patent: Mar. 19, 2013

(54) METHOD FOR APPLYING A COATING TO A SUBSTRATE

(76) Inventor: Wolfgang Klingel, Friolzheim (DE)

( * ) Notice: Subject to any disclaimer, the term of this patent is extended or adjusted under 35 U.S.C. 154(b) by 322 days.

(21) Appl. No.: 11/543,405

(22) Filed: Oct. 5, 2006

(65) Prior Publication Data

US 2007/0154647 A1 Jul. 5, 2007

Related U.S. Application Data

(62) Division of application No. 10/744,643, filed on Dec. 23, 2003, now abandoned.

(51) Int. Cl.
*B05D 1/30* (2006.01)
(52) U.S. Cl. ............ 427/472; 427/110; 427/421.1
(58) Field of Classification Search ............ 428/901; 427/168, 427.1, 472, 240, 272.3, 110, 421.1; 118/300, 323, 52, 320; 159/3; 62/74
See application file for complete search history.

(56) References Cited

U.S. PATENT DOCUMENTS

| | | | |
|---|---|---|---|
| 2,229,418 A | 1/1941 | Mason | |
| 4,649,061 A * | 3/1987 | Rangachar | 427/78 |
| 5,431,343 A | 7/1995 | Kubiak et al. | |
| 5,669,556 A | 9/1997 | Yoshida | |
| 5,720,820 A * | 2/1998 | Boger et al. | 118/669 |
| 6,170,760 B1 | 1/2001 | Bievenue et al. | |
| 6,378,734 B1 | 4/2002 | Ragsdale | |
| 6,565,010 B2 | 5/2003 | Anderson et al. | |
| 2002/0092918 A1* | 7/2002 | Anderson et al. | 239/8 |
| 2002/0179737 A1* | 12/2002 | Ryser | 239/418 |

FOREIGN PATENT DOCUMENTS

| | | |
|---|---|---|
| DE | 33 29 880 A1 | 3/1984 |
| JP | 408028743 A | 2/1996 |
| WO | WO 98/04887 | 2/1998 |

* cited by examiner

*Primary Examiner* — Michael Cleveland
*Assistant Examiner* — Tabassom Tadayyon Eslami
(74) *Attorney, Agent, or Firm* — Harness, Dickey & Pierce, P.L.C.

(57) ABSTRACT

The invention relates to an apparatus for coating a substrate (60), in particular a printed circuit board (61), with a device (16) for applying a coating material (material applying device) and a device (14) for supplying a gaseous medium (gas supplying device), the material applying device having an inner tubular element (16). The apparatus is distinguished by the fact that the gas supplying device has an outer tubular element (14) which is arranged coaxially in relation to the inner tubular element (16) and encloses the latter, so that a gas supply channel (19) is formed between the outer tubular element (14) and the inner tubular element (16), the supply channel (19) being designed in such a way that the gaseous medium flows out parallel to the coating material, in order to displace the coating material when it impinges on the substrate (60) and in this way distribute it over the surface area. Furthermore, the invention relates to a method for coating a substrate.

10 Claims, 1 Drawing Sheet

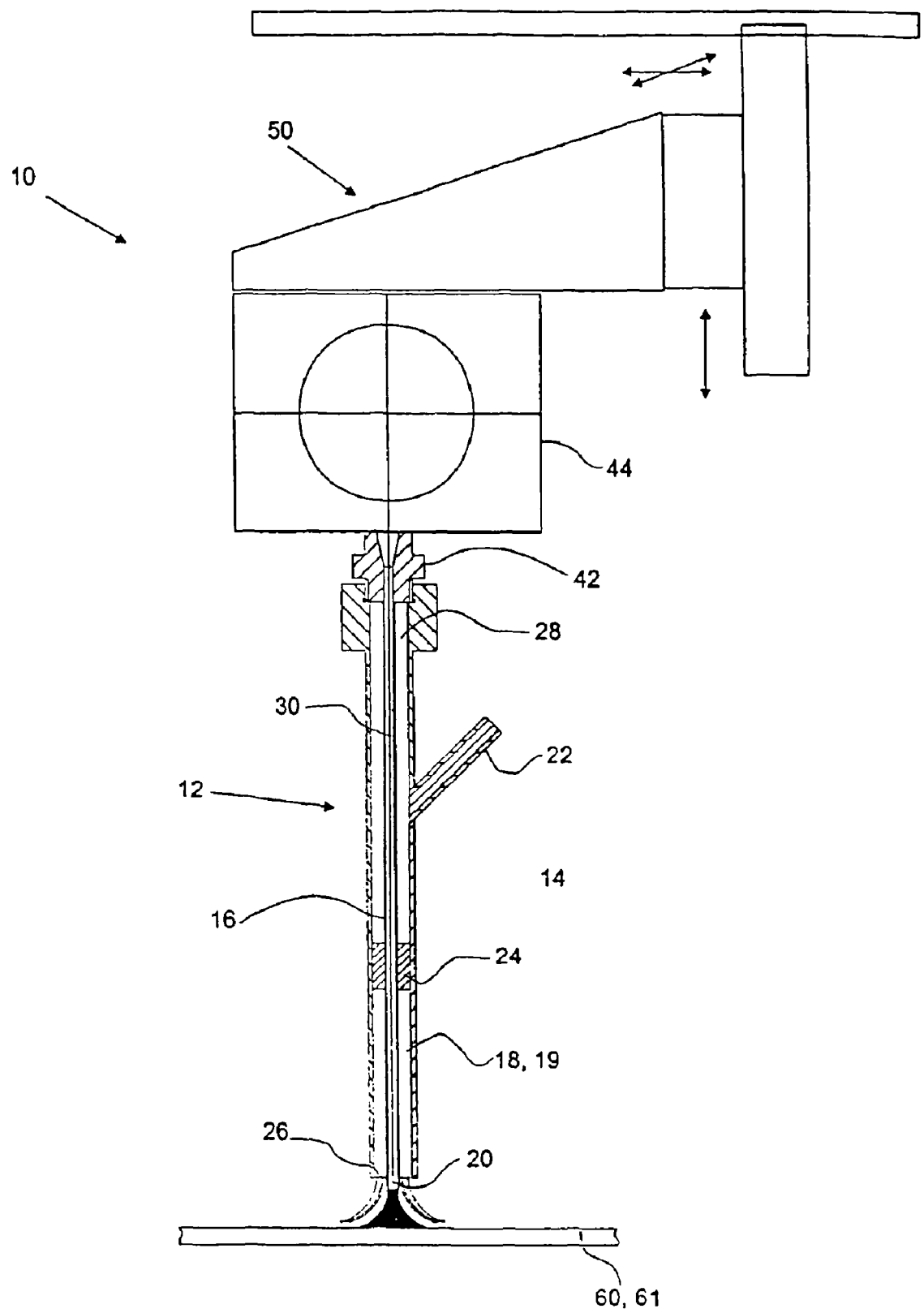

METHOD FOR APPLYING A COATING TO A SUBSTRATE

CROSSREFERENCE TO RELATED APPLICATION

This application is a divisional of U.S. application Ser. No. 10/744,643, filed Dec. 23, 2003, which claims priority of German patent application DE 102 61 576, filed on Dec. 23, 2002.

BACKGROUND OF THE INVENTION

The present invention relates to an apparatus for coating a substrate, in particular a printed circuit board, with a device for applying a coating material (material applying device), in particular a protective coating, and a device for supplying a gaseous medium (gas supplying device), the material applying device having an inner tubular element. The invention also relates to a method for coating a substrate with a coating material, preferably a printed circuit board with a protective coating.

Apparatuses and methods of the aforementioned type are generally known and are used for example for providing printed circuit boards with a protective coating. A major problem when coating printed circuit boards with a protective coating is in particular that of applying the protective coating accurately in just the right places. Small deviations or splashes of protective coating can very quickly lead to soiling of contacts, which later has the effect of malfunctions of the circuit.

Generally, so-called spraying methods are often used, operating with differently shaped spray nozzles to atomize a coating as it leaves a nozzle. Air-assisted atomizing of the coating produces a coating film that is complete in the center, but depleted toward the outside, forming a spray mist and splashes. This method of spraying is particular suitable for manual spraying by means of paint spray guns, because of the seamless transitions. Broad overlapping of the spray coats is a prerequisite for a uniform spray pattern, therefore no clearly delimiting coating edge can be formed.

A coating pattern with exact delimitation of the coating area and without a spray mist can be obtained with so-called airless spraying systems. Because these require exact, accurately repeatable spraying, the spray valves used are guided by robot systems. The overlapping of the spray coats should in this case be as small as possible, to avoid accumulations of material. In the prior art, different spray valves and constructions are known.

A known method for applying a protective coating is known by the name "Select-Coat? method" and is based on a slot nozzle which has a round hole on both sides. The protective coating is forced through this nozzle. Maintaining the coating film is made possible by the two streams of coating from the round holes. Substrates with relatively high obstacles, as represented for example by a printed circuit board, can only be coated unsatisfactorily, because, depending on the speed and height of the component, spray shadows form behind each obstacle passed over. Splashes also occur under these conditions. The viscosity of the coating must not exceed 200 mPas. Otherwise, the formation of splashes increases.

For higher-viscosity coating materials there exists a method which is known as the "Swirl-Coat method" and is based on a spray jet moved in a circular or elliptical manner. This method is well suited in the case of printed circuit boards for areas fitted with low components, whereas greatly varying layer thicknesses are produced on areas fitted with higher components. The application width of the sprayed area also changes with the unavoidably necessary changing of the distance of the nozzle from the substrate. This method is not suitable for the application of low-viscosity materials and coatings to printed circuit boards, because excessive differences in the height of the coating are produced. The spraying head cannot enter between high components because of its size.

DE 33 29 880 A1 discloses a spray valve which has a material nozzle, which distributes material at the nozzle outlet, and air nozzles, which direct the material stream of finely distributed droplets that is produced. Round or elliptical coating areas corresponding to the directing of the air stream are obtained and form coating paths. The spraying head cannot enter between high components because of its size. With the resultant increasing distance, the spray jet widens and produces splashes.

U.S. Pat. No. 6,170,760 B1 discloses an apparatus in which the air is guided around the coating material in the material nozzle in the form of an envelope. The coating is atomized as it leaves the spray valve. The nozzle may be made thin but not of any desired length, because otherwise the pulsation effect affecting this method intensifies. An excessively thin nozzle (<0.6 mm) also intensifies the pulsation and produces splashes. The pulsation occurs because the coating material tends toward the cone shape which it adopts in the air stream according to the speed, nozzle diameter and viscosity of the coating material. The air expanding as it leaves the nozzle produces splashes if the nozzle is too thin. For this reason, a narrow coating area cannot be produced, but only paths about 20 mm wide. Only low-viscosity coatings can be handled. With materials of higher viscosity, the pulsation increases, with the consequence that splashes are produced, because both air and material accumulations form in the spray nozzle, leading to irregular material delivery.

U.S. Pat. No. 6,132,809 A discloses a rotatable dual head, which is equipped with a dispensing head and a spraying head.

SUMMARY OF THE INVENTION

The object of the present invention is consequently to provide an apparatus and a method which are not affected by the disadvantages of the prior art. In particular, the apparatus and the method are intended to permit a coating in which no splashes are produced, a thick-layered and a thin-layered application are possible and the handling of high-viscosity and low-viscosity coatings is possible without changing the nozzle. Moreover, distribution of the coating material, for example behind legs of components on a printed circuit board, is also to be possible.

The object on which the invention is based is achieved by an apparatus of the type stated at the beginning by the gas supplying device having an outer tubular element which is arranged coaxially in relation to the inner tubular element and encloses the latter, so that a gas supply channel is formed between the outer tubular element and the inner tubular element, the supply channel being designed in such a way that the gaseous medium flows out parallel to the coating material, in order to displace the coating material when it impinges on the substrate and in this way distribute it over the surface area.

That is to say in other words that the apparatus applies the coating material to the substrate without air being supplied, i.e. it is not atomized, and this application is only evenly distributed on the substrate once it is there, by a gaseous medium, in particular compressed air, being correspondingly supplied. The distribution of the coating material therefore takes place evenly, since the air flows in an annular supply channel, which surrounds the stream of coating material.

This configuration readily allows the inner tubular element to be made as long as desired, with the result that it is also possible for coating to be carried out between relatively high components at a very small distance from the substrate. Consequently, it is possible to coat virtually without any splashing.

The layer thickness itself is governed by the amount of material, the material viscosity and the intensity of the air supplied (displacing air). When the bead of material that initially forms when the coating material is applied is displaced, a roll of material is produced, coating for example component legs on a printed circuit board in an enveloping manner and also reaching component legs and components lying in the spray shadow. Streaks forming due to any unevenness of the material are evened out in the case of materials which flow well, while they are even desired in the case of elastic materials of higher viscosity.

As already mentioned, very small distances between the substrate and the inner tubular element can be realized. This distance is preferably 6-10 mm. As a result, relatively high contacts, such as plugs, switches, etc., are certain to remain free from splashes. The forming of shortened round edges at corners caused by dragging of the bead is minimized by the small distance, assisted by the displacing air jet which virtually eliminates this dragging.

If, for example, low components such as surface mounted devices are coated, the roll produced by the displacing air advances over these components, envelops them completely and ends in the form of a clear delimitation of the coating surface that is not straight, corresponding to the additional material requirement, but free from mist and splashes.

The apparatus is suitable for coating with any flowable coating material that can be applied to the substrate from the inner tubular element. It is also suitable for high-viscosity, elastic substances, with which greater layer thicknesses can be produced. The pressure of the displacing air is increased in proportion to an increase in viscosity.

In a preferred development, the inner tubular element has an end portion of equal diameter, facing the substrate.

That is to say in other words that the end portion does not taper, as is provided for the forming of a nozzle in the prior art. The end portion of the outer tubular element preferably has a diameter of approximately 4 mm and the end portion of the inner tubular element up to about 0.8 mm.

This measure has the advantage that the two tubular elements can even enter very well between components that are very close together on a printed circuit board.

In a preferred development, a heating device is provided for heating the gaseous medium, the heated medium heating the coating material in the inner tubular element on its way through the outer tubular element.

This measure has the advantage that the viscosity of the previously already mentioned coating material can also be kept constant in the inner tube, in that corresponding heat is supplied to it. Consequently, a reproducible coating pattern can be achieved.

In a preferred development, the outer tubular element is assigned a valve, in order to interrupt the stream of the gaseous medium through the element.

This measure has the effect that a thick coating in the form of a material ramp can be achieved, in that the displacing air is switched off, i.e. interrupted. Consequently, regions such as, for example, rows of legs of ICs, etc. can be especially protected (with one and the same configuration of the inner and outer tubes).

In a preferred development, the gas supplying device has an admixing unit, in order to admix a powdered material with the gaseous medium.

This has the advantage that the properties of the coating material can be changed.

In a preferred development, the material applying device has a shut-off valve, the closing operation of which begins and ends the material flow in a way corresponding to an asymptotic curve. The shut-off valve is preferably a ball valve in the form of a three-way valve. It is particularly preferred if the opening and closing speed of the valve can be controlled.

These measures include the advantage that it is possible to a great extent to compensate for any changing of the speed with which the apparatus is moved, occurring when it is started, each time before it is stopped and each time it changes direction.

The object on which the invention is based is also achieved by a method of the type stated at the beginning which has the steps of:
  applying the coating material to the substrate in such a way that a bead is formed, and
  subjecting the bead to a jet of a gaseous medium, with the result that the bead is displaced and distributed over the surface area.

This method leads to the already mentioned advantages, so there is no need for them to be repeated.

The gaseous medium is preferably guided coaxially in relation to the coating material. The gaseous medium may be, for example, an inert gas, which has the advantage that undesired drying of the coating material on the inner tubular element is prevented.

Further advantages and refinements of the invention emerge from the description and the accompanying drawing.

It goes without saying that the features mentioned above and still to be explained below can be used not only in the combination respectively specified but also in other combinations, or on their own, without departing from the scope of the present invention.

BRIEF DESCRIPTION OF THE DRAWING

The invention is now explained in more detail on the basis of an exemplary embodiment with reference to the drawing. In the single FIGURE, a schematic representation of an apparatus for coating a substrate is represented in a side view.

DETAILED DESCRIPTION OF AN PREFERRED EMBODIMENT

In the FIGURE, the nozzle region (coating head) of a coating installation is represented and identified by the reference numeral 10. A coating installation is used, for example, for applying a protective coating to a printed circuit board, in order to protect the conductor tracks from moisture, for example.

The coating installation comprises a nozzle device 12, which is substantially made up of two tubes 14, 16. The tube 14 lies on the outside (referred to hereafter as outer tube) and surrounds the inner tube 16. The two tubes 14, 16 are arranged coaxially in relation to each other, so that an annular region 18 is formed between the inner tube 16 and the outer tube 14.

As the FIGURE reveals, the inner tube 16 ends with an offset in relation to the outer tube 14, so that a protruding end portion 20 is obtained.

Fitted on the outer tube 14 is a tubular supply stub 22, which opens out into the annular region 18. A gaseous medium can be introduced into the annular region 18 via this supply stub 22. Arranged within this annular region 18, which forms an annular channel 19, is a flow element 24, which makes the flow of the gaseous medium laminar, i.e. free from eddies, up to the open end 26 of the annular channel 19. The end 28 of the annular channel 19 opposite from the open end 26 is closed, so that the gaseous medium cannot escape at this point. Although in the FIGURE the open end 26 of the outer tube 14 has the same diameter as the annular channel, it is also conceivable to reduce the diameter, in order in this way to allow the outflowing air to flow more closely against the inner tube.

The inner tube 16 likewise forms a channel 30, which extends coaxially in relation to the annular channel 19 and is likewise open at the end portion 20. Provided at the opposite end of the inner tube 16 is a head 42, which is connected to a shut-off valve 44. Furthermore, the head 42 is inserted or screwed into an end portion of the outer tube 14. The shut-off valve is provided for controlling the supply of a coating material into the channel 30. The gaseous medium supplied via the supply stub 22 is also controlled by means of a shut-off valve that is not represented. In the present exemplary embodiment, the shut-off valve 44 is configured as a three-way valve, so that, apart from the coating material, a cleaning solution can also be introduced for cleaning the channel 30.

The nozzle device 12 is attached to an arm 50, which is only schematically indicated in the FIGURE and allows the movement of the nozzle device 12 in several dimensions. The arrows shown in the FIGURE indicate the directions of movement. Apart from these translatory movements, swiveling movements are also possible.

The application of a coating material to a substrate 60, for example a printed circuit board 61, can consequently be carried out as follows:

The coating material, for example a protective coating, is guided into the channel 30 of the inner tube 16 via the shut-off valve 44 from a storage container that is under air pressure and not represented in the FIGURE. At the end portion 20, the coating material leaves in the form of a jet or in the form of drops and forms a bead on the printed circuit board 61 when the nozzle device 12 moves in relation to the printed circuit board 61. In order to distribute this bead over the surface area on the printed circuit board 61, air or an inert gas is introduced into the supply stub 22, flows through the annular channel 19 and leaves at the open end 26 of the outer tube 14. On account of the coaxial arrangement of the two tubes 14, 16, the air flows parallel to the jet of coating material and displaces the coating material when it impinges on the printed circuit board 61. By appropriate setting of the pressure and the amount of air, the kind of displacement on the printed circuit board 61 can be set. The flow element 24 is given the task here of making the air that is flowing into the annular channel free from eddies and laminar, so that the air flows out in a laminar manner in relation to the stream of material.

The supply of air can be interrupted by means of the shut-off valve if it is necessary to apply a thicker layer of material to the printed circuit board 61.

The interruption of the stream of material through the channel 30 must be performed in such a way that no pressure is exerted any longer on the material located in the channel, in order in this way to prevent dripping. This is possible for example by a closure being arranged at right angles to the direction of flow of the coating material.

Apart from the charging of the channel 30 with coating material by means of a storage container that is under pressure, it is also conceivable to arrange a metering pump, which guides coating material into the channel 30 from a storage container.

On account of the small dimensions of the nozzle device 12, for example the outside diameter of the outer tube is only 4 mm, the end portion 20 of the inner tube 16 can even be brought up very close to components on the printed circuit board 61 that are arranged close together, for example to within 6 to 10 mm of them. This allows splashes to be avoided very effectively.

In addition, the tubes forming the channels are simple components, with the result that it is possible for the nozzle device 12 to be produced at low cost.

What is claimed is:

1. A method for coating a substrate with a coating material comprising the steps of:
    applying the coating material in a liquid state along an axis directly onto the substrate in non-atomized liquid form so that a bead of liquid coating material is formed on the substrate,
    providing a jet of a gaseous medium so that it flows separately from and in a laminar manner in relation to said liquid coating material coaxially and parallel to said axis to the substrate, and
    after the applying step subjecting the bead of liquid coating material formed on the substrate to said jet of a gaseous medium, with the result that the bead is displaced and distributed over a surface area of the substrate.

2. The method of claim 1, wherein said substrate is a printed circuit board, and the coating material is a protective coating.

3. The method as claimed in claim 1, wherein the gaseous medium is an inert gas.

4. The method as claimed in claim 1, wherein the gaseous medium is heated.

5. The method as claimed in claim 1, wherein a powdered additive is admixed with the gaseous medium.

6. The method as claimed in claim 1, wherein low-viscosity and high-viscosity coating materials are used.

7. The method as claimed in claim 1, wherein a casting resin (hotmelt adhesive) is used as coating material.

8. The method of claim 1, wherein the coating material is applied through an inner tubular element and the jet of a gaseous medium is provided through an outer tubular element that surrounds said inner tubular element.

9. The method of claim 8, wherein each of the inner tubular element and the outer tubular element has an open end that is positioned above the surface of the substrate so that the liquid coating material dispensed from said inner tubular element is surrounded by the jet of gaseous medium emitted from the outer tubular element as the dispensed liquid coating material travels to the surface of the substrate.

10. The method of claim 9, wherein the open end of the inner tubular element extends along said axis beyond the open end of the outer tubular element.

\* \* \* \* \*

UNITED STATES PATENT AND TRADEMARK OFFICE
CERTIFICATE OF CORRECTION

PATENT NO. : 8,399,067 B2  
APPLICATION NO. : 11/543405  
DATED : March 19, 2013  
INVENTOR(S) : Wolfgang Klingel Page 1 of 1

It is certified that error appears in the above-identified patent and that said Letters Patent is hereby corrected as shown below:

Title Page, Item (30) Foreign Application Priority Data,

Insert the following:

-- (30) Foreign Application Priority Data

Dec. 23, 2002 (DE) ...... 102 61 576.4 --.

Signed and Sealed this  
Seventh Day of May, 2013

Teresa Stanek Rea  
*Acting Director of the United States Patent and Trademark Office*